US012587142B2

(12) United States Patent
Miyake et al.

(10) Patent No.: US 12,587,142 B2
(45) Date of Patent: Mar. 24, 2026

(54) CLASS-D AMPLIFIER

(71) Applicant: YAMAHA CORPORATION,
Hamamatsu (JP)

(72) Inventors: Yoshiro Miyake, Hamamatsu (JP);
Masao Noro, Hamamatsu (JP)

(73) Assignee: YAMAHA CORPORATION,
Hamamatsu (JP)

( * ) Notice: Subject to any disclaimer, the term of this
patent is extended or adjusted under 35
U.S.C. 154(b) by 480 days.

(21) Appl. No.: 18/362,039

(22) Filed: Jul. 31, 2023

(65) Prior Publication Data

US 2023/0378914 A1     Nov. 23, 2023

Related U.S. Application Data

(63) Continuation of application No.
PCT/JP2022/010000, filed on Mar. 8, 2022.

(30) Foreign Application Priority Data

Mar. 17, 2021     (JP) ................................. 2021-043176

(51) Int. Cl.
*H03F 1/26*     (2006.01)
*H03F 3/217*     (2006.01)
(52) U.S. Cl.
CPC ............. *H03F 1/26* (2013.01); *H03F 3/2171*
(2013.01); *H03F 2200/171* (2013.01); *H03F*
*2200/267* (2013.01)
(58) Field of Classification Search
CPC .... H03F 1/26; H03F 3/2171; H03F 2200/171;
H03F 2200/267

(Continued)

(56) References Cited

U.S. PATENT DOCUMENTS 5,371,479 A * 12/1994 Hagerty ................... H03F 1/34
330/99
6,297,692 B1 10/2001 Nielsen
(Continued)

FOREIGN PATENT DOCUMENTS

JP        H0433361 A      2/1992
WO     2018186154 A1   10/2018
WO     2018221273 A1   12/2018

OTHER PUBLICATIONS

International Search Report issued in International Appln. No.
PCT/JP2022/010000, mailed Jun. 14, 2022. English translation
provided.

(Continued)

*Primary Examiner* — Hafizur Rahman
(74) *Attorney, Agent, or Firm* — ROSSI, KIMMS &
McDOWELL LLP

(57) ABSTRACT

A single printed-circuit board of a class-D amplifier includes
an input ground, an output ground, an input amplifying
circuit, a modulation circuit, an output amplifying circuit,
and an output filter, a solid pattern, a first feedback circuit,
and a second feedback circuit. The solid pattern of the output
ground extends into all regions of the input amplifying
circuit, the modulation circuit, the output amplifying circuit
and the output filter. The first feedback circuit executes a
feedback where a voltage at a first connecting point is
negatively fed back to an inverting input of the input
amplifying circuit. The second feedback circuit executes a
feedback where a voltage at a second connecting point is
negatively fed back to a non-inverting input of the input
amplifying circuit.

9 Claims, 2 Drawing Sheets

(58) Field of Classification Search
USPC ......................................................... 330/251
See application file for complete search history.

(56) References Cited

U.S. PATENT DOCUMENTS

| | | | |
|---|---|---|---|
| 11,139,231 B2 | 10/2021 | Honda | |
| 11,239,876 B2 | 2/2022 | Nakagawa | |
| 12,003,222 B2 * | 6/2024 | Xia ........................ | H03F 1/3205 |
| 2002/0097090 A1 * | 7/2002 | Smedegaard-Pedersen ................ | H03F 3/181 |
| | | | 330/251 |
| 2005/0253664 A1 | 11/2005 | Hyvonen | |
| 2019/0245494 A1 * | 8/2019 | Ohtani .................. | H03F 3/2171 |

OTHER PUBLICATIONS

Written Opinion issued in International Appln. No. PCT/JP2022/010000, mailed Jun. 14, 2022. English translation provided.
International Preliminary Report on Patentability issued in International Appln. No. PCT/JP2022/010000, mailed Sep. 28, 2023. English translation provided.

* cited by examiner

CLASS-D AMPLIFIER

CROSS-REFERENCE TO RELATED APPLICATIONS

The present application is a continuation application of International Application No. PCT/JP2022/10000, filed on Mar. 8, 2022, which claims priority to Japanese Patent Application No. 2021-043176, filed on Mar. 17, 2021. The entire contents of these applications are incorporated herein in their entirety.

BACKGROUND ART

This disclosure relates to a class-D amplifier configured to drive a load by a pulse modulated based on an input signal.

There is known a class-D amplifier comprising an input amplifying circuit configured to amplify an input signal, a modulating-and-amplifying circuit configured to output a pulse generated by performing pulse width modulation based on an output signal from the input amplifying circuit, and an output filter configured to pass a low-frequency component of the pulse output from the modulating-and-amplifying circuit so as to supply the low-frequency component to the load. The class-D amplifier negatively feeds an output signal of the output filter back to an input of the input amplifying circuit. According to the class-D amplifier, it is possible to amplify the input signal with high efficiency and low distortion.

SUMMARY

In recent years, since semiconductor switching elements constituting the class-D amplifier have improved in performance, switching speed of the class-D amplifier becomes higher than the conventional class-D amplifier by one order of magnitude or more. However, higher switching frequency of the class-D amplifier increases parasitic emissions of electromagnetic waves from the class-D amplifier.

An aspect of the disclosure related to a class-D amplifier capable of decreasing parasitic emissions in the class-D amplifier.

In one aspect of the disclosure, a class-D amplifier includes a single printed-circuit board including an input ground configured to provide a first reference voltage, an output ground configured to provide a second reference voltage, an input amplifying circuit configured to amplify an input signal based on the input ground and including an inverting input and a non-inverting input, a modulation circuit configured to output a pulse that is modulated based on the amplified input signal, an output amplifying circuit configured to amplify the modulated pulse based on the output ground, an output filter configured to pass a first low-frequency component of the amplified modulated pulse to generate an output signal, a solid pattern of the output ground that extends into all regions of the input amplifying circuit, the modulation circuit, the output amplifying circuit and the output filter, a first feedback circuit configured to execute a first negative feedback where a voltage, at a first connecting point with which a first end of a load connects in the output filter, is negatively fed back to the inverting input of the input amplifying circuit, and a second feedback circuit configured to execute a second negative feedback where a voltage, at a second connecting point with which a second end of the load connects in the solid pattern, is negatively fed back to the non-inverting input of the input amplifying circuit.

Another aspect of the disclosure, a class-D amplifier includes a single printed-circuit board including an input ground configured to provide a first reference voltage, an output ground configured to provide a second reference voltage, an input amplifying circuit configured to amplify an input signal based on the input ground, a modulation circuit configured to output a pulse that is modulated based on the amplified input signal, a switching frequency of the output pulse being higher than 1.7 MHz, an output amplifying circuit configured to amplify the modulated pulse based on the output ground, an output filter configured to pass a first low-frequency component of the amplified modulated pulse to generate an output signal, and a solid pattern of the output ground that extends into all regions of the input amplifying circuit, the modulation circuit, the output amplifying circuit and the output filter.

BRIEF DESCRIPTION OF THE DRAWINGS

The objects, features, advantages, and technical and industrial significance of the present disclosure will be better understood by reading the following detailed description of the embodiments, when considered in connection with the accompanying drawings, in which.

DETAILED DESCRIPTION

Figure 1:
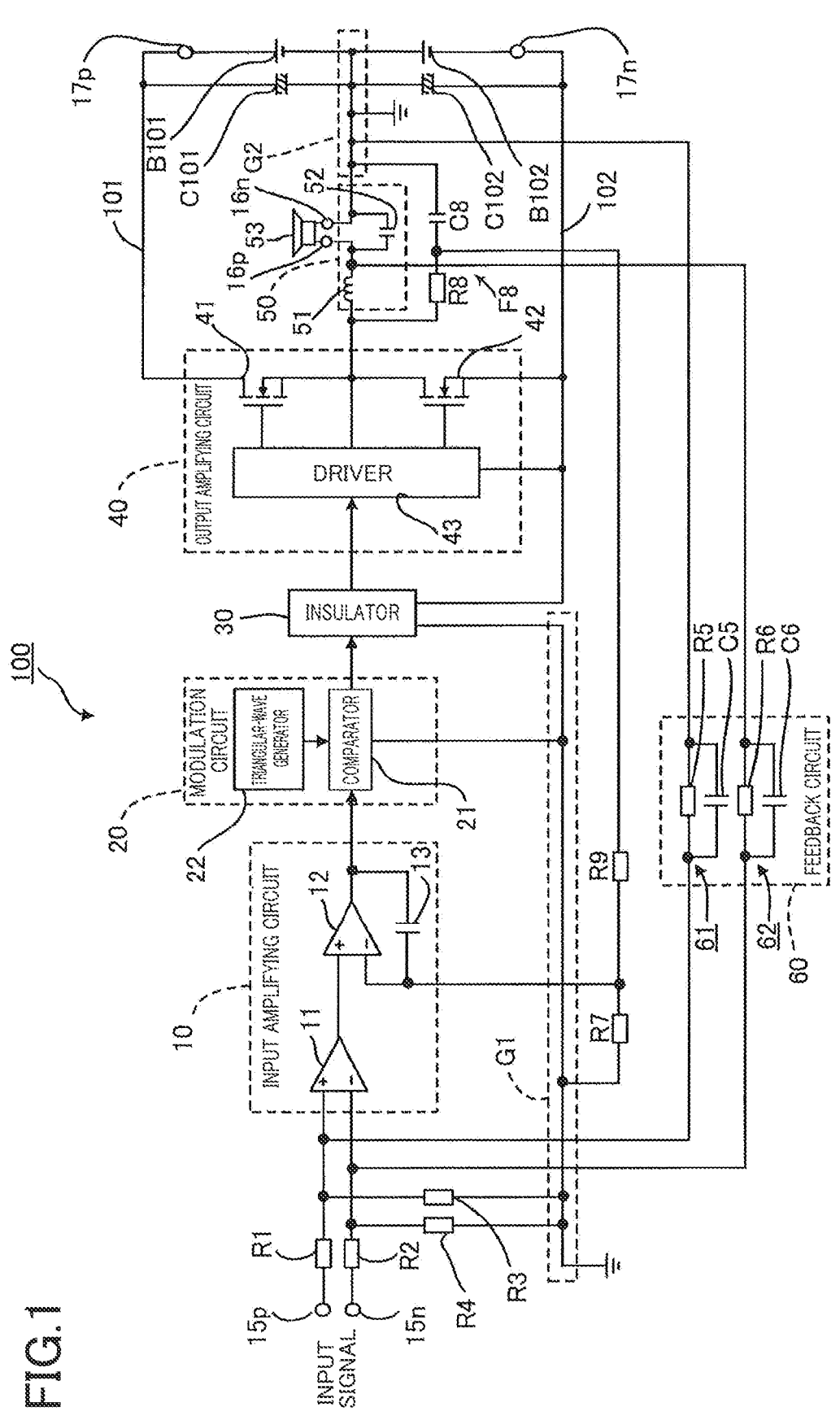
FIG. 1 is a schematic circuit diagram illustrating a configuration of a class-D amplifier of the present disclosure.

Hereinafter, there will be described an embodiment of the present disclosure by reference to drawings. FIG. 1 is a schematic circuit diagram illustrating a configuration of a class-D amplifier 100 as the embodiment of the present disclosure. The class-D amplifier 100 includes an input amplifying circuit 10, a modulation circuit 20, an insulator 30, an output amplifying circuit 40, an output filter 50 and a feedback circuit 60. In the class-D amplifier 100, each of the input amplifying circuit 10 and the modulation circuit 20 functions by using an input ground G1 as a reference voltage, and the output amplifying circuit 40 functions by using an output ground G2 as a reference voltage.

The input amplifying circuit 10 is an amplifier configured to amplify an input signal which is a voltage difference between an input terminal $15p$ and an input terminal $15n$, and the input amplifying circuit 10 includes a differential amplifier 11 as an input stage, a differential amplifier 12 as a rear stage, and a capacitor 13. A non-inverting input of the input amplifying circuit 10, that is, a non-inverting input of the differential amplifier 11 is connected to the input terminal $15p$ via a resistor R1 and connected to the input ground G1 via a resistor R3. Moreover, an inverting input of the input amplifying circuit 10, that is, an inverting input of the differential amplifier 11 is connected to the input terminal $15n$ via a resistor R2 and connected to the input ground G1 via a resistor R4. The differential amplifier 11 amplifies a voltage difference between a positive phase input signal and a negative phase input signal respectively supplied from the input terminal $15p$ and the input terminal $15n$ via the resistor R1 and the resistor R2. The capacitor 13 is connected between an output of the differential amplifier 12 and the inverting input of the differential amplifier 12 so that the differential amplifier 12 functions as an integrator. The integrator integrates a voltage difference between a signal output from the differential amplifier 11 and a first feedback signal, which is a divided voltage, supplied from an intermediate node between a resistor R9 and a resistor R7, which will be described below. As a result of this, the differential amplifier 12 outputs the integrated signal as a first output signal amplified by the input amplifying circuit 10.

The modulation circuit 20 includes a comparator 21 and a triangular-wave generator 22 configured to output a triangular wave signal having a predetermined frequency as a carrier wave signal. The comparator 21 compares the first output signal with the triangular wave signal output from the triangular-wave generator 22 and outputs a first pulse generated by performing Pulse Width Modulation based on the first output signal.

The insulator 30 is a circuit configured to transmit the first pulse to an input of the output amplifying circuit 40 in a state in which an input of the output amplifying circuit 40 is electrically insulated from an output of the modulation circuit 20. The insulator 30 is constituted of, for example, a photo-coupler, a transformer, and so on. More specifically, the insulator 30 generates a voltage between an input of the output amplifying circuit 40 and a low-voltage power supply line 102, as the insulated first pulse, and the generated voltage is in proportion to a voltage difference between an output of the modulation circuit 20 and the input ground G1. It is noted that a level shifter configured to shift a voltage of the first pulse and output the shifted first pulse may be used in place of the insulator 30.

The output amplifying circuit 40 includes a driver 43, output-stage transistors 41 and 42, each transistor capable of power switching at a high frequency higher than 1.7 MHz. For example, each of the output-stage transistors 41 and 42 is GaN transistor, that is, Gallium nitride Transistor. A positive voltage is supplied to a drain of the output-stage transistor 41 from a positive power supply B101, which is externally provided, via a power supply line 101 and a power supply terminal 17p. A source of the output-stage transistor 41 is connected to a drain of the output-stage transistor 42, and a common connection node of the output-stage transistor 41 and the output-stage transistor 42 is an output of the output amplifying circuit 40. Moreover, a negative voltage is supplied to a source of the output-stage transistor 42 from a negative power supply B102, which is externally provided, via a power supply line 102 and a power supply terminal 17n. A reference voltage of each of the positive power supply B101 and the negative power supply B102 is the output ground G2. A power supply capacitor C101 is connected in parallel to the positive power supply B101, and a power supply capacitor C102 is connected in parallel to the negative power supply B102.

The driver 43 is a circuit configured to drive the output-stage transistors 41 and 42 based on the insulated first pulse. More specifically, the driver 43 switches the output-stage transistor 41 ON and switches the output-stage transistor 42 OFF in a case where a voltage of the insulated first pulse is lower than, for example, a predetermined reference voltage. Moreover, the driver 43 switches the output-stage transistor 41 OFF and switches the output-stage transistor 42 ON in a case where the voltage of the insulated first pulse is higher than, for example, the predetermined reference voltage. Due to high speed switching of the output-stage transistors 41 and 42, a large amount of current with high frequency flows to an output portion of the class-D amplifier 100. It is preferable to shorten a current path on a printed-circuit board 300 so as to increase power efficiency and decrease parasitic emissions.

Accordingly, the first pulse is given to the driver 43 of the output amplifying circuit 40 via the insulator 30, and this generates a second pulse that is output from an output portion of the output amplifying circuit 40. The second pulse is a pulse including a H level signal corresponding to the positive voltage of the power supply line 101 and a L level signal corresponding to the negative voltage of the power supply line 102. In this manner, the output amplifying circuit 40 executes power amplification of the first pulse and outputs the amplified first pulse as the second pulse.

The output filter 50 is constituted of an inductor 51 and a capacitor 52 connected to each other in series and disposed between the output portion of the output amplifying circuit 40 and the output ground G2. And, a common connection node of the inductor 51 and the capacitor 52 is connected to an output terminal 16p of the class-D amplifier 100, and a connection node in the output ground G2 to the capacitor 52 is connected to an output terminal 16n of the class-D amplifier 100. And, a load 53 is connected between the output terminals 16p and 16n. The load 53 is, for example, a speaker, however, the load 53 may be a motor, a light-emitting device or the like. The output filter 50 passes a first low-frequency component of the PWM pulse amplified by the output amplifying circuit 40, that is, the second pulse, and the output filter 50 generates an output signal to be supplied to the load 53. In a case where an input signal is an audio signal, the audio signal is generated, as the output signal, by power amplification of the input signal. The first low-frequency component is a component of the second pulse from which a high-frequency component is eliminated by the output filter 50. Since the class-D amplifier 100 has a high switching frequency, a cut-off frequency of the output filter 50 may be higher than a cut-off frequency of a common class-D amplifier.

A low-pass filter F8 constituted of a resistor R8 and a capacitor C8 connected to each other in series is connected to the output filter 50 in parallel. And, the resistor R9 and the resistor R7 are connected to each other in series and disposed between (i) a common connection node of the resistor R8 and the capacitor C8 and (ii) the input ground G1, and a common connection node of the resistor R9 and the resistor R7 is connected to the inverting input of the differential amplifier 12 of the input amplifying circuit 10. The low-pass filter F8, the resistor R8 and the capacitor C8 constitute a third feedback circuit. In the class-D amplifier 100, a second low-frequency component of the second pulse output from the output amplifying circuit 40 passes through the low-pass filter F8 as the first feedback signal, and the first feedback signal is divided by the resistor R9 and the resistor R7. The divided first feedback signal is negatively fed back to the input of the differential amplifier 12, which is the rear-stage of the differential amplifier 11. A cut-off frequency of the low-pass filter F8 is higher than a cut-off frequency of the output filter 50. It is noted that the negative feedback by the third feedback circuit is an optional operation, and the third feedback circuit may be dispensed with. This negative feedback enables the class-D amplifier 100 to further improve linearity of amplification of an area from the differential amplifier 12 to the output terminal.

The feedback circuit 60 includes a second feedback circuit 61 constituted of a resistor R5 and a capacitor C5 connected to each other in parallel and a first feedback circuit 62 constituted of a resistor R6 and a capacitor C6 connected to each other in parallel. The second feedback circuit 61 negatively feeds a voltage of the output ground G2, which is a cold side voltage of the output signal, back to the non-inverting input of the differential amplifier 11 of the input amplifying circuit 10, as a third feedback signal. The first feedback circuit 62 negatively feeds a voltage of the common connection node of the inductor 51 and the capacitor 52, which is a hot side voltage of the output signal, back to the inverting input of the differential amplifier 11 of the input amplifying circuit 10, as a second feedback signal. That is, the feedback circuit 60 negatively feeds a voltage at a first connecting point with which a first end of the load 53 in the output filter 50 connects, which is the common connection node of the inductor 51 and the capacitor 52, back to the input of the class-D amplifier 100, and the feedback circuit 60 further negatively feeds a voltage at a second connecting point with which a second end of the load 53 in the output ground G2 connects, which is a connecting point with the capacitor 52, back to the input of the class-D amplifier 100. These negative feedbacks improve linearity of amplification of the whole area of the class-D amplifier 100, which is an area from the input terminal to the output terminal. Since the feedback circuit 60 negatively feeds the voltage of the output terminal 16*n* in addition to the voltage of the output terminal 16*p* back, it is possible to suppress the adverse effect to the output signal even when the voltage of the output ground G2 connected to the output terminal 16*n* dynamically changes at a high switching frequency.

Figures 2, 3:
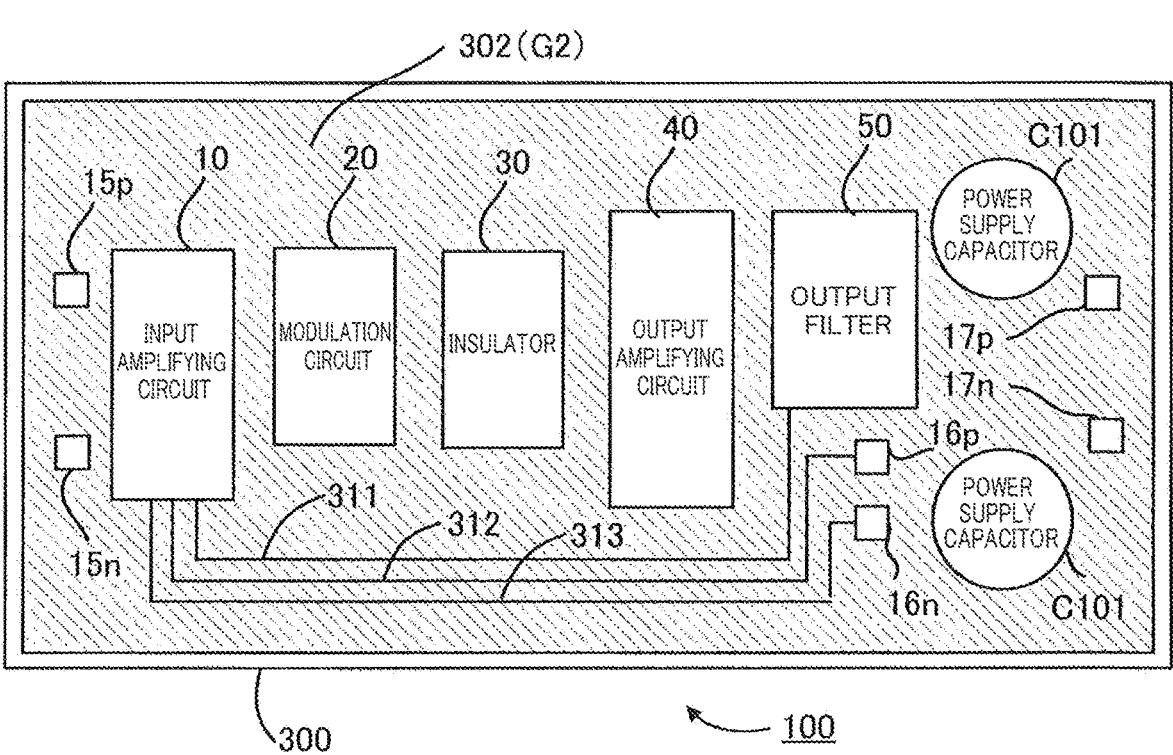
FIG. 2 is a layout diagram illustrating a configuration of the class-D amplifier mounted on a printed circuit board.
FIG. 3 is a layout diagram illustrating a comparative example of a class-D amplifier.

FIG. 2 is a layout diagram illustrating a configuration of the class-D amplifier 100 mounted on a single printed circuit board 300. As illustrated in FIG. 2, the input amplifying circuit 10, the modulation circuit 20, the insulator 30, the output amplifying circuit 40, the output filter 50, the power supply capacitors C101 and C102, each illustrated in FIG. 1, are mounted on the printed-circuit board 300. The output amplifying circuit 40, the output filter 50, the power supply capacitors C101 and C102 are disposed adjacent to each other so as to shorten a current path in the output part of the class-D amplifier 100.

Moreover, the input terminal 15*p*, the input terminal 15*n*, the output terminal 16*p*, the output terminal 16*n*, the power supply terminal 17*p*, and the supply terminal 17*n*, each illustrated in FIG. 1, are provided on the printed-circuit board 300. A balanced audio signal transmitted from, for example, a sound source, which is not illustrated, is given to the input terminal 15*p* and the input terminal 15*n*, as the input signal. The load 53, such as an external speaker, is connected between the output terminal 16*p* and the output terminal 16*n*. And, the external positive power supply B101 and the external negative power supply B102 are respectively connected to the power supply terminal 17*p* and the power supply terminal 17*n*.

Moreover, a feedback path 311, a feedback path 312, and a feedback path 313 are formed on the printed-circuit board 300. The feedback path 311 is configured to feed the first feedback signal back to the input amplifying circuit 10 from the output filter 50. The feedback path 312 is configured to feed the second feedback signal back to the input amplifying circuit 10 from the output terminal 16*p*. The feedback 313 is configured to feed the third feedback signal back to the input amplifying circuit 10 from the output terminal 16*n* connected to the output ground G2.

Here, the feedback path 311 includes the third feedback circuit that is constituted of the low-pass filter F8, the resistor R9 and the resistor R7, each illustrated in FIG. 1, at a position close to the input amplifying circuit 10. The feedback path 312 includes the first feedback circuit 62, illustrated in FIG. 1, at a position close to the input amplifying circuit 10. The feedback path 313 includes the second feedback circuit 61, illustrated in FIG. 1, at a position close to the input amplifying circuit 10. And, a solid pattern 302 of the output ground G2 that extends into all regions of the input amplifying circuit 10, the modulation circuit 20, the insulator 30, the output amplifying circuit 40, the output filter 50, the power supply capacitor C101, the power supply capacitor C102, the feedback path 311, the feedback path 312, and feedback path 313 is formed on the printed-circuit board 300. The printed-circuit board 300 has a multilayer structure, and the solid pattern 302 is formed on a layer different from a layer on which wires of other circuits including the amplifying circuits, the feedback paths and so on, other than the solid pattern 302, are formed. And, in the present embodiment, the third feedback circuit of the feedback path 311 negatively feeds a second low-frequency component of the second pulse back to the inverting input of the rear-stage differential amplifier 12 as the first feedback signal, the first feedback circuit 62 of the feedback path 312 negatively feeds the voltage of the first connecting point back to the inverting input of the input amplifying circuit 10 as the second feedback signal, and the second feedback circuit 61 of the feedback path 313 negatively feeds the voltage of the second connecting point back to the non-inverting input of the input amplifying circuit 10 as the third feedback signal.

According to the present embodiment, since the solid pattern 302 of the output ground G2 is formed so as to extend into all regions of the circuits constituting the class-D amplifier 100, especially, extend into all regions of the input amplifying circuit 10, the modulation circuit 20, the output amplifying circuit 40, and the output filter 50, it is possible to decrease parasitic emissions of the class-D amplifier 100 even when an output current having a switching frequency higher than a common class-D amplifier by one order of magnitude or more flows.

FIG. 3 is a layout diagram illustrating a state of mounting in a printed-circuit board 300 of a common class-D amplifier 100' having a low switching frequency lower than 1.7 MHz, which is a comparative example of the class-D amplifier of the present embodiment. In the class-D amplifier 100' having a low switching frequency, the solid pattern 302 of the output ground G2 is formed so as to extend into regions of the output amplifying circuit 40 and the output filter 50, which are positioned at the rear-stage of the insulator 30. As a result of this, it is possible to sufficiently decrease parasitic emissions. And, in order to prevent entry of a noise into an input signal, a solid pattern 301 of the input ground G1, which is different and separated from the solid pattern 302, is formed so as to extend into regions of the input amplifying circuit 10 and the modulation circuit 20. Moreover, since the low-switching-frequency of the class-D amplifier 100' reduces the effect of inductance in the current path, there is no need to form the feedback path 313 of the class-D amplifier 100 of the present embodiment on the comparative class-D amplifier 100'.

In the present embodiment, illustrated in FIG. 2, in order to prevent parasitic emissions at the high switching frequency, the solid pattern 302 of the output ground G2, an area of which is larger than the comparative example, is formed so as to extend into all regions of the input amplifying circuit 10, the modulation circuit 20, the output amplifying circuit 40 and the output filter 50.

In the class-D amplifier 100 of the present embodiment, since the solid pattern 302 is formed broadly, it becomes more difficult to specify the current path of the output. Moreover, the high switching frequency of the class-D amplifier 100 increases the adverse effect of the inductance in the current path.

In the present embodiment, however, the second feedback signal of the output terminal 16*p*, which is the connecting point with the first end of the load 53 in the output filter 50, is negatively fed back to the input amplifying circuit 10 through the feedback path 312, and the third feedback signal of the output terminal 16*n*, which is the connecting point with the second end of the load 53 in the solid pattern 302 of the output ground G2, is negatively fed back to the input amplifying circuit 10 through the feedback path 313. Accordingly, it is possible to amplify the input signal without making a distortion factor worse, even in the severe situation of the broad solid pattern 302 and the high switching frequency. Moreover, in the present embodiment, since the output-stage transistor 41 and the output-stage transistor 42 perform power switching at a frequency higher than 1.7 MHz, there is an advantage in which the switching noise does not interrupt an AM (Amplitude modulation) radio because of a difference between a frequency band of the AM radio and a frequency range of the switching noise.

Other Embodiments

While the embodiment has been described above, it is to be understood that the disclosure is not limited to the details of the illustrated embodiment, but may be embodied with various changes and modifications, which may occur to those skilled in the art, without departing from the spirit and scope of the disclosure. Other embodiments are, for example, as follows.

In the present embodiment, the modulation circuit 20 outputs a PWM (Pulse Width Modulation) pulse generated by performing pulse width modulation based on the signal amplified by the input amplifying circuit 10, however, the modulation circuit 20 may output a PDM (Pulse Density Modulation) pulse generated by performing pulse density modulation based on the signal amplified by the input amplifying circuit 10.

The input ground G1 may be a solid pattern, however, the input ground G1 may be a normal ground wire. The input ground G1 may be connected to the solid pattern 302 of the output ground G2 through a low impedance device regardless of whether the input ground G1 is the solid pattern or not.

In the present embodiment, the GaN transistor is used as the output-stage transistor 41 and the output transistor 42, however, another transistor capable of performing equivalent high-speed and efficient power switching may be used.

In the present embodiment, the triangular-wave signal is used as the carrier wave signal, however, a signal having another waveform such as a saw-tooth pulse may be used.

What is claimed is:

1. A class-D amplifier comprising:
a single printed-circuit board including:
an input ground configured to provide a first reference voltage;
an output ground configured to provide a second reference voltage;
an input amplifying circuit configured to amplify an input signal based on the input ground and including an inverting input and a non-inverting input;
a modulation circuit configured to output a pulse that is modulated based on the amplified input signal;
an output amplifying circuit configured to amplify the modulated pulse based on the output ground;
an output filter configured to pass a first low-frequency component of the amplified modulated pulse to generate an output signal;

a solid pattern of the output ground that extends into all regions of the input amplifying circuit, the modulation circuit, the output amplifying circuit and the output filter;
a first feedback circuit configured to execute a first negative feedback where a voltage, at a first connecting point with which a first end of a load connects in the output filter, is negatively fed back to the inverting input of the input amplifying circuit; and
a second feedback circuit configured to execute a second negative feedback where a voltage, at a second connecting point with which a second end of the load connects in the solid pattern, is negatively fed back to the non-inverting input of the input amplifying circuit.

2. The class-D amplifier according to claim 1, wherein:
the output filter includes an inductor and a capacitor connected to each other in series and disposed between an output of the output amplifying circuit and the output ground, and
the first connecting point is a common connection node of the inductor and the capacitor.

3. The class-D amplifier according to claim 2,
wherein the second connecting point is where the second end of the load connects in the output ground.

4. The class-D amplifier according to claim 2,
wherein the solid pattern extends further into regions of a first path of the first negative feedback by the first negative feedback circuit and a second path of the second negative feedback by the second negative feedback circuit.

5. The class-D amplifier according to claim 4,
wherein the first path is formed along the second path formed on the single printed-circuit board.

6. The class-D amplifier according to claim 4, wherein:
the single printed-circuit board further includes a third negative feedback circuit configured to execute a third negative feedback where a second low-frequency component of the amplified pulse is negatively fed back to the input amplifying circuit, and
the solid pattern extends further into a region of a third path of the third negative feedback by the third negative feedback circuit.

7. The class-D amplifier according to claim 6, wherein:
the single printed-circuit board further includes an insulator configured to electrically insulate an output of the modulation circuit from an input of the output amplifying circuit, and
the solid pattern extends further into a region of the insulator.

8. The class-D amplifier according to claim 1,
wherein the output amplifying circuit includes a GaN transistor configured to amplify the pulse.

9. A class-D amplifier comprising:
a single printed-circuit board including:
an input ground configured to provide a first reference voltage;
an output ground configured to provide a second reference voltage;
an input amplifying circuit configured to amplify an input signal based on the input ground;
a modulation circuit configured to output a pulse that is modulated based on the amplified input signal, a switching frequency of the output pulse being higher than 1.7 MHz;

an output amplifying circuit configured to amplify the modulated pulse based on the output ground;

an output filter configured to pass a first low-frequency component of the amplified modulated pulse to generate an output signal; and a solid pattern of the output ground that extends into all regions of the input amplifying circuit, the modulation circuit, the output amplifying circuit and the output filter.

\* \* \* \* \*